(12) United States Patent
Watanabe

(10) Patent No.: US 8,039,204 B2
(45) Date of Patent: Oct. 18, 2011

(54) MANUFACTURING METHOD OF SILICON CARBIDE SEMICONDUCTOR APPARATUS

(75) Inventor: Hiroshi Watanabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 629 days.

(21) Appl. No.: 12/172,453

(22) Filed: Jul. 14, 2008

(65) Prior Publication Data

US 2009/0029293 A1    Jan. 29, 2009

(30) Foreign Application Priority Data

Jul. 25, 2007 (JP) ................... 2007-193121
Mar. 26, 2008 (JP) ................... 2008-080672

(51) Int. Cl.
*G03F 7/26* (2006.01)
(52) U.S. Cl. .......................... 430/315; 430/312
(58) Field of Classification Search ................ 430/313, 430/314, 312, 330
See application file for complete search history.

(56) References Cited

U.S. PATENT DOCUMENTS

| 5,804,088 A * | 9/1998 | McKee ................ 216/47 |
| 6,566,178 B2 * | 5/2003 | Shih ..................... 438/163 |
| 2006/0220027 A1 * | 10/2006 | Takahashi et al. ........ 257/77 |

FOREIGN PATENT DOCUMENTS

| JP | 2001-068428 | * 3/2001 |
| JP | 2002-343810 | 11/2002 |
| JP | 2006-128191 | 5/2006 |

* cited by examiner

*Primary Examiner* — Kathleen Duda
*Assistant Examiner* — Caleen Sullivan
(74) *Attorney, Agent, or Firm* — Oblon, Spivak, McClelland, Maier & Neustadt, L.L.P.

(57) ABSTRACT

A manufacturing method of a silicon carbide semiconductor apparatus is provided. The method includes forming a first resist pattern on a surface of a silicon carbide layer formed on a silicon carbide substrate, implanting a first conduction type impurity ion in the silicon carbide layer on which the first resist pattern is formed, forming a second resist pattern by decreasing a width of the first resist pattern with etching and forming a deposition layer on the surface of the silicon carbide layer which is not covered with the second resist pattern, and implanting a second conduction type impurity ion in the silicon carbide layer on which the second resist pattern is formed, through the deposition layer.

9 Claims, 6 Drawing Sheets

MIXTURE RATE OF DEPOSITION EFFECT GAS ($C_3F_8$)

MIXTURE RATE OF DEPOSITION EFFECT GAS ($CF_4$)

MANUFACTURING METHOD OF SILICON CARBIDE SEMICONDUCTOR APPARATUS

BACKGROUND OF THE INVENTION

1. Field of the Invention

This invention relates to a manufacturing method of a silicon carbide semiconductor apparatus such as a high-power silicon carbide vertical MOSFET.

2. Description of the Related Art

In a manufacturing method of a silicon carbide MOSFET (Metal Oxide Semiconductor Field Effect Transistor) which is a kind of silicon carbide semiconductor apparatus, it is necessary to make a channel length uniform to make a threshold voltage even in order to obtain the silicon carbide MOSFET with the same on resistance.

In a manufacturing method of a related-art silicon carbide semiconductor apparatus in order to obtain a uniform channel length, a channel region is formed in the portion in which an inorganic material mask pattern is widened in a self-alignment manner by forming the inorganic material mask pattern on a silicon carbide substrate, implanting a first conduction type impurity ion, forming an inorganic material film on the inorganic material mask pattern and its etch back, and implanting a second conduction type impurity ion in order (for example, JP-A-2006-128191, pages 9 to 13).

Also, in a manufacturing method of a related-art conventional thin film transistor, as a method for forming an LDD (Lightly Doped Drain) part in a self-alignment manner, there is a method wherein after a resist pattern in which a width of the base is larger than a width of the top is formed on a film used as a gate electrode, the film used as the gate electrode is removed and a high concentration ion is implanted and a part of the thickness of the resist pattern is removed by dry etching and the film used as the gate electrode is removed and a low concentration ion is implanted in order (for example, JP-A-2002-343810 (pages 4 to 6).

In the manufacturing method of the related art silicon carbide semiconductor apparatus as described in JP-A-2006-128191, the whole surface of the inorganic material film is etched back in order to widen the inorganic material mask pattern, so that shapes of the portions in which the inorganic material mask pattern is widened vary. Then, as compared with the inorganic material mask pattern before widening, the edge portion of a cross-sectional shape rounded or an angle of inclination of the side portion does not become constant and lengths of widening of basal portions vary. Thus, the inorganic material mask pattern cannot be widened with a cross-sectional shape changed in a conformal mapping manner from the inorganic material mask pattern before widening, so that there is a problem that a width of a channel region formed in the widened portion does not become constant and on resistances vary.

Also, when a method for decreasing a width of a resist mask by removing a part of the thickness of the resist pattern in which a width of the base is larger than a width of the top by dry etching as described in the manufacturing method of the related-art thin film transistor is applied to a self-alignment formation method of a channel region of a silicon carbide semiconductor apparatus, a problem that a surface of a silicon carbide layer which is not covered with the resist pattern is exposed to plasma and thereby an electric charge due to plasma damage occurs on a surface of a silicon carbide film used as the channel region and a threshold voltage of the silicon carbide semiconductor apparatus varies might arise.

SUMMARY OF THE INVENTION

The present invention has been made in view of the above circumstance and provides a method for manufacturing a silicon carbide semiconductor apparatus with a uniform channel length to have the same threshold voltage in a self-alignment manner.

Accordingly, it is an aspect of the present invention to provide a manufacturing method of a silicon carbide semiconductor apparatus. The method comprises: forming a first resist pattern on a surface of a silicon carbide layer formed on a silicon carbide substrate; implanting a first conduction type impurity ion in the silicon carbide layer on which the first resist pattern is formed; forming a second resist pattern by decreasing a width of the first resist pattern with etching and forming a deposition layer on the surface of the silicon carbide layer which is not covered with the second resist pattern; and implanting a second conduction type impurity ion in the silicon carbide layer on which the second resist pattern is formed, through the deposition layer.

According to the above-described configuration, a silicon carbide semiconductor apparatus with a uniform channel length and the same threshold voltage can be manufactured in a self-alignment manner.

BRIEF DESCRIPTION OF THE DRAWINGS

Embodiments of the present invention will be described in detail based on the following figures, wherein.

DETAILED DESCRIPTION OF THE INVENTION

Embodiment

FIGS. 1 to 8 are sectional schematic diagrams showing a manufacturing method of a MOSFET (Metal Oxide Semiconductor Field Effect Transistor) as an example of a silicon carbide semiconductor apparatus according to an embodiment of the present invention. A processing procedure of the manufacturing method of the embodiment will hereinafter be described with reference to these drawings.

Figure 1:
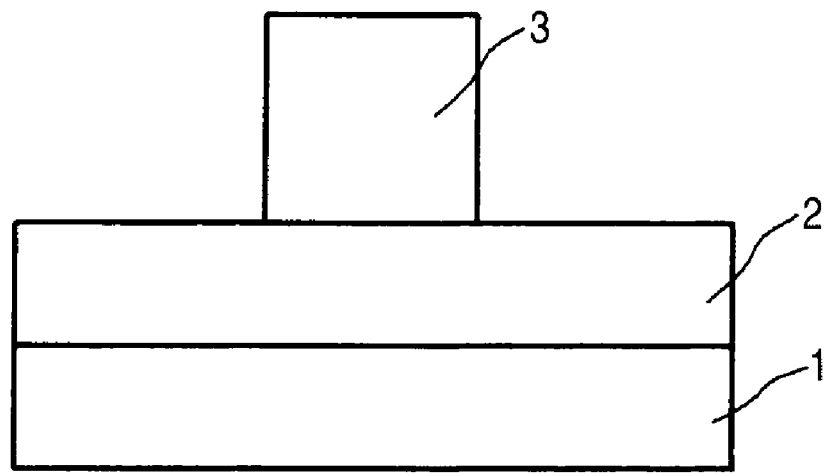
FIG. 1 is a sectional schematic diagram showing a manufacturing method of a silicon carbide semiconductor apparatus according to an embodiment of the present invention.

First, as shown in FIG. 1, a silicon carbide drift layer 2 which is a silicon carbide layer is epitaxially grown on a surface of an $n^+$-type silicon carbide substrate 1. A film thickness of the silicon carbide drift layer 2 is set at 20 μm and an n-type impurity concentration is set at $1 \times 10^{16}/cm^3$.

Subsequently, a first resist pattern 3 with a height of 2.5 μm is formed by applying a positive type photoresist to a surface of the silicon carbide drift layer 2 and performing heating, pattern transfer by photolithography and development by an alkaline developing solution in order (a first mask formation step). Here, a substance using a photosensitive material, a base resin and an organic solvent as a main component is used as the positive type photoresist.

Figure 2:
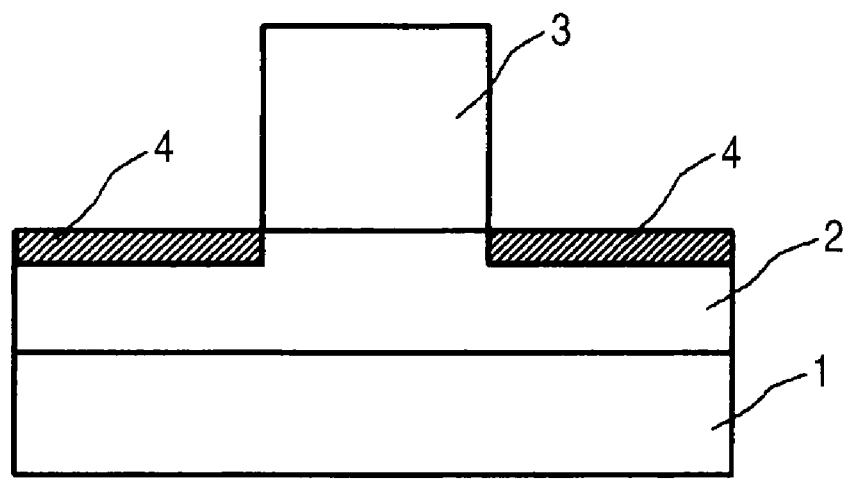
FIG. 2 is a sectional schematic diagram showing the manufacturing method of the silicon carbide semiconductor apparatus according to the embodiment of the present invention.

Next, as shown in FIG. 2, nitrogen ions as which are first conduction type impurity ions and are used as n-type impurities are implanted in the silicon carbide drift layer 2 (a first ion implantation step) in a state of the first resist pattern 3 on the surface of the silicon carbide drift layer 2 being formed. By this ion implantation, a source region 4 is formed in the portion which is not covered with the first resist pattern 3 on the surface of the silicon carbide drift layer 2. In the first ion implantation step, the nitrogen ions are implanted so that a concentration of nitrogen becomes substantially constant at $3 \times 10^{19}/cm^3$ from the surface of the silicon carbide drift layer 2 to a depth of 0.3 μm (called a box profile). A temperature of the silicon carbide substrate 1 at the time of ion implantation is set at 25° C.

At this time, in the first resist pattern 3, curing of the first resist pattern 3 is caused by implantation of the nitrogen ions and particularly, its surface vicinity cures more. This is because by implantation of the nitrogen ions, a decomposition reaction of the base resin or the photosensitive material of the first resist pattern 3 occurs and an acid substance such as a hydrogen ion or an organic acid is generated as a reaction product and simultaneously a reaction of cross-linking between the base resins occurs. Thus, the first resist pattern 3 cures, so that even by dry etching described below, a cross-sectional shape of the first resist pattern 3 changes in a conformal mapping manner and the edge portion becomes resistant to be rounded.

Figure 3:
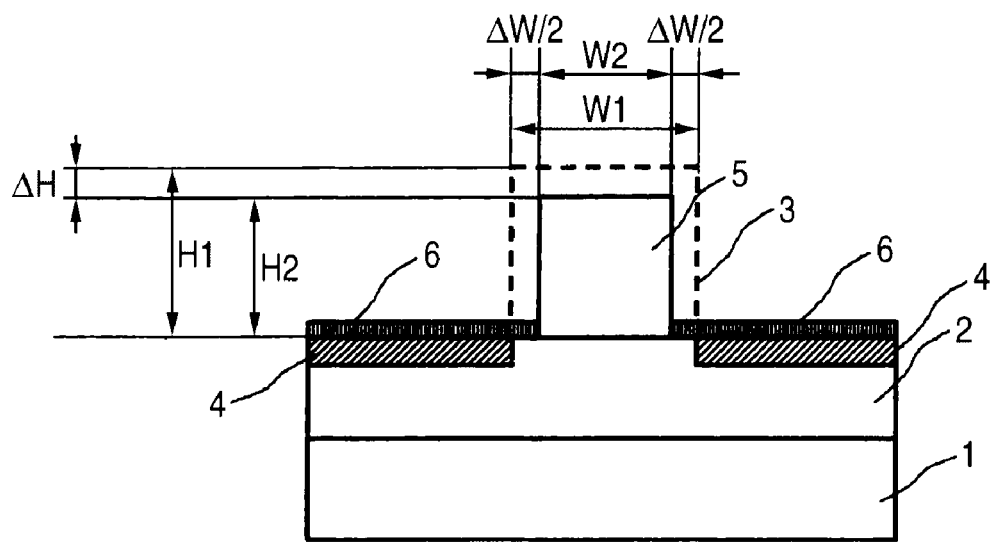
FIG. 3 is a sectional schematic diagram showing the manufacturing method of the silicon carbide semiconductor apparatus according to the embodiment of the present invention.

Subsequently, dry etching is performed in a structure shown in FIG. 2 using oxygen gas and propane octafluoride ($C_3F_8$) gas which is deposition effect gas. By this dry etching, as shown in FIG. 3, a width and a height of the first resist pattern 3 decrease and the first resist pattern 3 results in a second resist pattern 5 and also a deposition layer 6 is formed in the portion which is not covered with the second resist pattern 5 among the surface of the silicon carbide drift layer 2 including the source region 4 (a second mask formation step). Using a plasma etching apparatus of an inductively coupled plasma type, mixed gas of oxygen gas and $C_3F_8$ gas is used as etching gas and a gas pressure is set at 1 Pa and antenna power is set at 800 W and substrate bias power is set at 0 W and thereby the dry etching is performed. A mixture rate of the $C_3F_8$ gas is 25%. Here, the mixture ratio between the oxygen gas and the deposition effect gas such as the $C_3F_8$ gas is represented by a ratio between a gas flow rate of the deposition effect gas and a total gas flow rate of the oxygen gas and the deposition effect gas as a mixture rate (%) of the deposition effect gas. Specifically, the mixture ratio is defined by a formula of the mixture rate (%) of the deposition effect gas= (the gas flow rate of the deposition effect gas/the total gas flow rate of the oxygen gas and the deposition effect gas)×100.

Here, the reason why the deposition layer 6 is formed is because a reaction product in which plasma etching gases react mutually or a reaction product between plasma etching gas and the first resist pattern 3 constructed of an organic material is deposited on the surface of the silicon carbide drift layer 2 during the dry etching. The fact that the surface of the silicon carbide drift layer 2 has carbon unlike the case of a silicon substrate also works advantageously in formation of the deposition layer 6. Also, this deposition layer 6 is formed on the surface (interface between a gate insulating film and a channel region described below) of the silicon carbide drift layer 2 which is covered with the first resist pattern 3 and is not covered with the second resist pattern 5, and the deposition layer 6 and the second resist mask 5 are connected and formed.

At this time, H1-H2 obtained from a height (H1) of the first resist pattern 3 and a height (H2) of the second resist pattern 5 is set at ΔH, and W1-W2 obtained from a width (W1) of the first resist pattern 3 and a width (W2) of the second resist pattern 5 is set at ΔW as shown in FIG. 3. Here, the height and width of the first resist pattern 3 and the second resist pattern 5 (hereinafter simply called the resist patterns) respectively refer to a distance from the top of a cross-sectional shape of the resist pattern to the surface of the silicon carbide drift layer 2 and a width of a basal portion of the resist pattern in the cross-sectional shape. In the resist pattern, the width is equally decreased in cross-sectional right and left directions, so that ΔW/2 (half of ΔW) becomes the amount of etching of a side surface of the resist pattern as shown in FIG. 3.

In the embodiment, ΔH and ΔW are respectively 0.8 μm and 2 μm. Also, a film thickness of the deposition layer 6 after dry etching is 30 nm.

Also, in the decreases in the height and width of the resist patterns shown in FIG. 3, a ratio of ΔH to ΔW is defined as a trimming ratio. In the embodiment, the trimming ratio is 0.4, but a resist pattern film thickness more than or equal to a predetermined height required as a mask of ion implantation is required in a second ion implantation step described below, so that it is desirable that a value of the trimming ratio be small.

The trimming ratio becomes 0.5 when the dry etching is isotropic, and the trimming ratio becomes a value larger than 0.5 when the dry etching is anisotropic etching in which the amount of decrease in the height of the resist pattern is larger than the amount of etching of the side surface of the resist pattern.

It is necessary to use anisotropic etching in which the amount of decrease in the height of the resist pattern is smaller than the amount of etching of the side surface of the resist pattern in order to set the trimming ratio at a value smaller than 0.5. For that purpose, the proportion of a deposition effect among the deposition effect and an etching effect of the resist pattern competitively caused during the dry etching could be increased. By being constructed thus, the amount of etching of the top of the resist pattern to the amount of etching of the side surface of the resist pattern can be reduced and the trimming ratio can be reduced.

Further, in the first ion implantation step, the nitrogen ions are implanted in the top of the first resist pattern 3, so that the fact that the top of the first resist pattern 3 cures more than the side surface of the first resist pattern 3 also has an effect of reducing the trimming ratio. This is also backed by a phenomenon found by us, in which an etching rate of the resist pattern in which ions are implanted becomes lower than an etching rate of the resist pattern in which ions are not implanted.

By such curing of the top of the resist pattern by ion implantation and dry etching conditions of reducing the trimming ratio, a cross-sectional shape of the resist pattern can be changed in a conformal mapping manner.

Also, in the embodiment, the substrate bias power at the time of dry etching is set at 0 W, and this purpose is to lower energy incident on a substrate of plasma etching gas. As a result of this, there is an effect of reducing the trimming ratio by suppressing the amount of decrease in the height of the resist pattern at the time of etching. However, an etching condition of the embodiment is not limited to the substrate bias power of 0 W as long as a desired trimming ratio can be obtained.

In the dry etching of the second mask formation step of the embodiment, the mixture rate of $C_3F_8$ gas is set at 25% as described above, and this gas mixture rate is a mixture rate in which $\Delta W$ is a positive value and a mixture rate of $O_2$ gas and $C_3F_8$ gas is in the range from 10% to 100% and the trimming ratio is minimized. The case of other dry etching gas and a relation between the trimming ratio and the mixture rate of $O_2$ gas and $C_3F_8$ gas will be described below in detail.

In addition, when dry etching is performed using only $O_2$ gas, the trimming ratio becomes a large value of 1.5 and it becomes difficult to ensure the height (H2) of the second resist pattern 5. Also, an unnecessary oxide film is formed on the surface of the silicon carbide drift layer 2.

Figure 4:
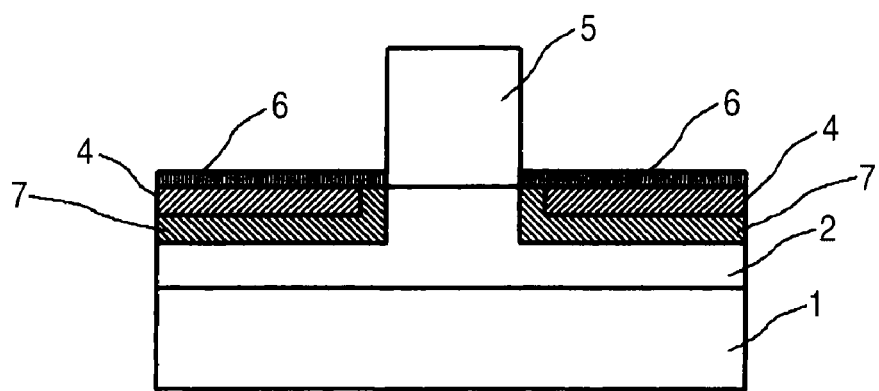
FIG. 4 is a sectional schematic diagram showing the manufacturing method of the silicon carbide semiconductor apparatus according to the embodiment of the present invention.

Then, as shown in FIG. 4, aluminum (Al) ions which are second conduction type impurity ions and are p-type impurities are implanted in the silicon carbide drift layer 2 in a state of forming the second resist pattern 5 on the surface of the silicon carbide drift layer 2 (a second ion implantation step). In the second ion implantation step, the Al ions are implanted so that a concentration of Al becomes constant at $2 \times 10^{18}/cm^3$ from the surface of the silicon carbide drift layer 2 including the source region 4 to a depth of 0.8 μm (called a box profile). A temperature of the silicon carbide substrate 1 at the time of ion implantation is set at 25° C.

In the sectional schematic diagram after the second ion implantation step shown in FIG. 4, the portion other than the source region 4 formed by the first ion implantation step among the region of the silicon carbide drift layer 2 in which the Al ions are implanted by the second ion implantation step is formed in a base region 7. The Al ions which are the p-type impurities for giving a conduction type opposite to that of the nitrogen ions used as the n-type impurities implanted in the first ion implantation step are also implanted in the source region 4 in the second ion implantation step. However, a volume density of ions implanted in the first ion implantation step is higher than a volume density of ions implanted in the second ion implantation step, so that the source region 4 becomes an n type after an activation annealing step described below. The base region 7 becomes a p type after the activation annealing step described below since the p-type impurities more than an n-type impurity concentration of the initial silicon carbide drift layer 2 are implanted in the second ion implantation step.

Figure 5:
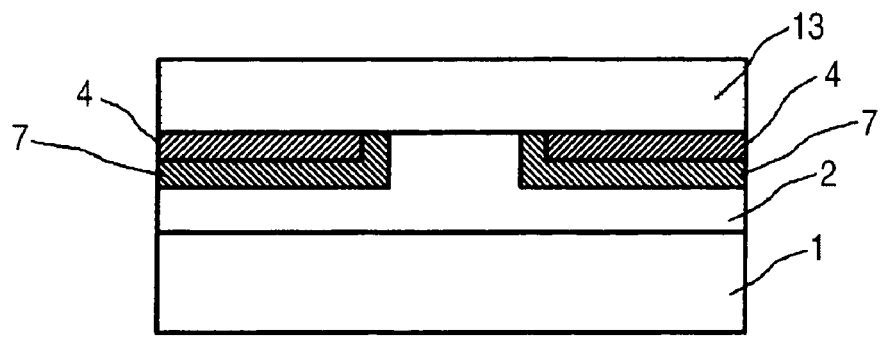
FIG. 5 is a sectional schematic diagram showing the manufacturing method of the silicon carbide semiconductor apparatus according to the embodiment of the present invention.

Subsequently, as shown in FIG. 5, after the second resist pattern 5 and the deposition layer 6 are removed, a carbon protective layer 13 is formed on the surface of the silicon carbide drift layer 2 including the source region 4 and the base region 7 and activation annealing which is annealing for activating the impurity ions implanted in the first ion implantation step and the second ion implantation step is performed. Annealing conditions are 10 minutes and 1700° C. in an Ar gas atmosphere. The carbon protective layer 13 is removed after the activation annealing (an activation annealing step).

Figure 6:
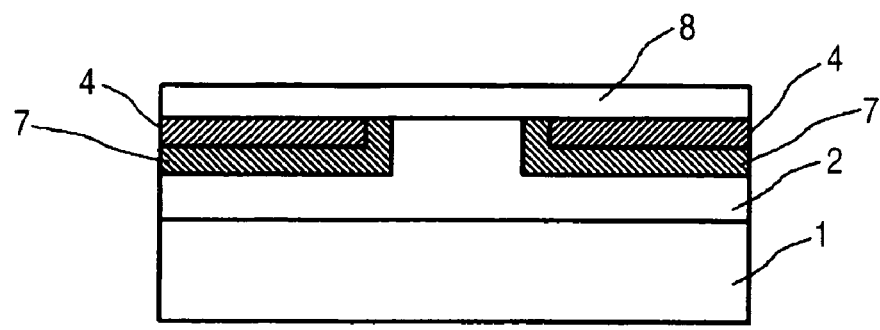
FIG. 6 is a sectional schematic diagram showing the manufacturing method of the silicon carbide semiconductor apparatus according to the embodiment of the present invention.
Figure 7:
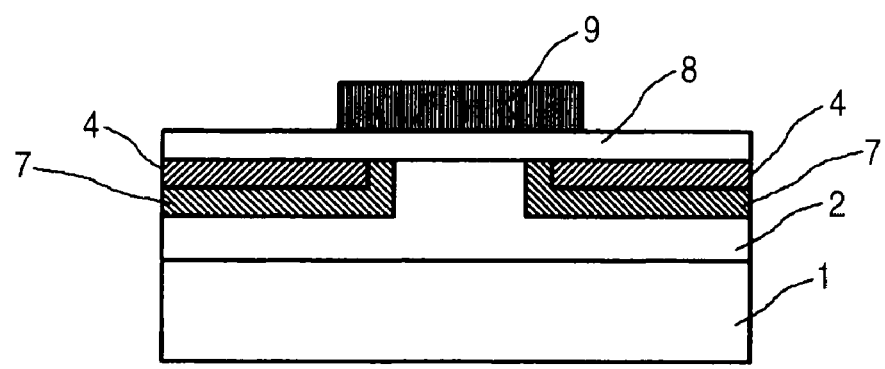
FIG. 7 is a sectional schematic diagram showing the manufacturing method of the silicon carbide semiconductor apparatus according to the embodiment of the present invention.

Then, as shown in FIG. 6, the surface of the silicon carbide drift layer 2 including the source region 4 and the base region 7 is thermally oxidized and a gate insulating film 8 with a desired thickness is formed (a gate insulating film formation step). Subsequently, as shown in FIG. 7, a polycrystalline silicon film giving conductivity is formed on the gate insulating film 8 by a low pressure CVD method and this silicon film is patterned and thereby, a gate electrode 9 is formed (a gate formation step).

Figure 8:
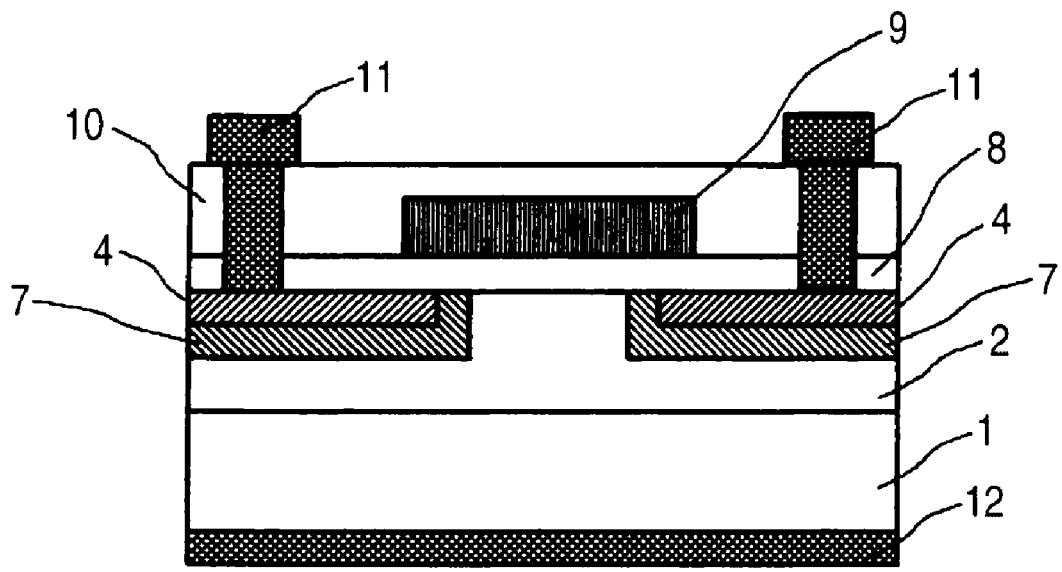
FIG. 8 is a sectional schematic diagram showing the manufacturing method of the silicon carbide semiconductor apparatus according to the embodiment of the present invention.
Figure 9:
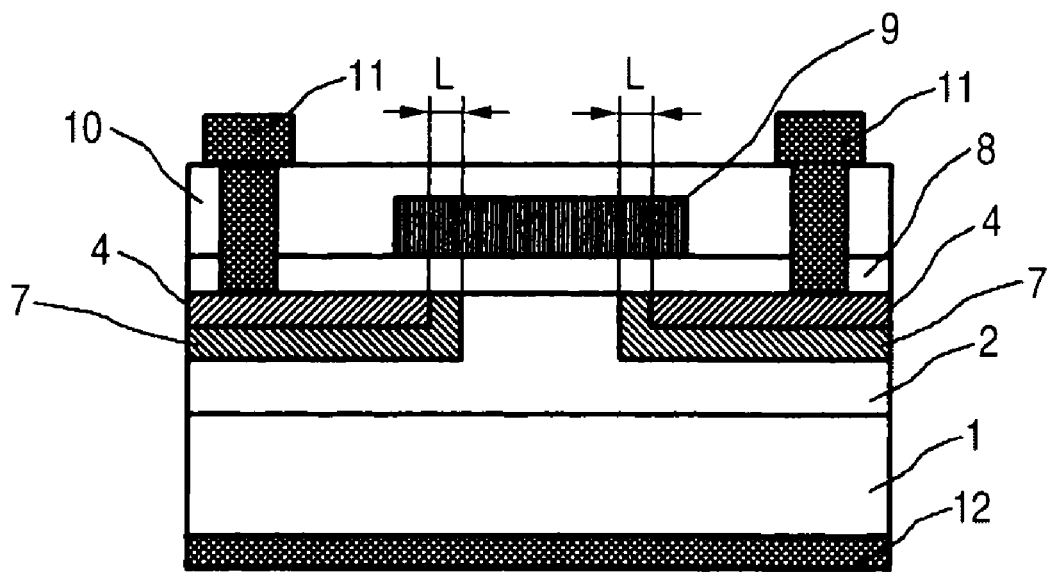
FIG. 9 is a sectional schematic diagram showing the silicon carbide semiconductor apparatus according to the embodiment of the present invention.

Thereafter, as shown in FIG. 8, after an interlayer insulating film 10 made of a silicon oxide is formed on the gate insulating film 8 and the gate electrode 9, the interlayer insulating film 10 and the gate insulating film 8 are opened and source electrodes 11 and internal wiring (not shown) are formed. Also, a drain electrode 12 is formed on the back side of the silicon carbide substrate 1 (an electrode formation step). An alloy in which Al is a main component is used as material of the source electrodes 11 and the drain electrode 12. FIG. 9 is a sectional schematic diagram of the silicon carbide semiconductor apparatus manufactured in the embodiment and in FIG. 9, a region opposed to the gate electrode 9 through the gate insulating film 8 of the base region 7 is called a channel region, and a distance sandwiching the channel region between the source region 4 and a region in which ions are not implanted in the silicon carbide drift layer 2 is called a channel length L. In this manner, the silicon carbide MOSFET which is the silicon carbide semiconductor apparatus shown in FIG. 9 is manufactured.

According to the manufacturing method of the silicon carbide semiconductor apparatus according to the embodiment thus, a cross-sectional shape of a resist pattern can be changed in a conformal mapping manner by performing dry etching using mixed gas of oxygen gas having an etching effect with respect to the resist pattern and deposition effect gas having a deposition effect with respect to the resist pattern, so that a channel length corresponding to a difference between widths of the resist patterns before and after etching becomes constant and variations in on resistance decrease. Also, the silicon carbide semiconductor apparatus with the same threshold voltage can be manufactured in a self-alignment manner by an effect of a deposition layer for protecting an interface between a channel region and an gate insulating film from plasma damage at the time of the dry etching of the resist pattern.

Also, according to the manufacturing method of the silicon carbide semiconductor apparatus according to the embodiment, for example, it is unnecessary to perform a film formation step required in the case of using an inorganic material as a mask by simultaneously adjusting a dimension of the resist pattern and forming the deposition layer for protecting a surface of a silicon carbide layer, and it has an effect capable of reducing a manufacturing cost by greatly reducing the number of steps as compared with the case of using an inorganic material film in a mask of ion implantation.

Further, it has an effect capable of independently controlling the amount of decrease in a width and the amount of decrease in a height of the resist pattern by adjusting a trimming ratio and etching time.

A relation between a trimming ratio and a mixture rate of $O_2$ gas and deposition effect gas will herein be described in detail.

Figure 10:
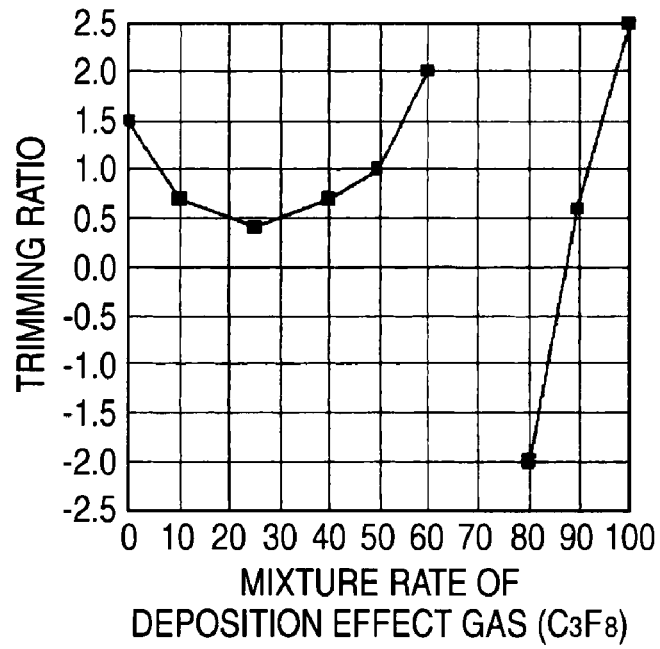
FIG. 10 is a diagram of relation between a trimming ratio and a mixture rate of deposition effect gas in the embodiment of the present invention.

First, a relation between a trimming ratio and a mixture rate of $C_3F_8$ gas at the time of dry etching of the case where deposition effect gas is $C_3F_8$ gas is shown in FIG. 10.

In FIG. 10, when the mixture rate of $C_3F_8$ gas is increased from 0%, the trimming ratio decreases from 1.5 which is a value of the case where $C_3F_8$ gas is not mixed, and becomes 0.7 at a mixture rate of 10% and becomes 0.4 at a mixture rate of 25% and when the mixture rate is further increased, the trimming ratio increases to 0.7 at a mixture rate of 40% and increases to 1.0 at a mixture rate of 50%. The reason why the trimming ratio increases thus is because $\Delta W$ which is the amount of decrease in a dimension of a resist pattern approaches 0, and when the mixture rate becomes 60%, the trimming ratio becomes 2.0 exceeding 1.5 which is the trimming ratio of the case where $C_3F_8$ gas is not mixed.

When the mixture rate is further increased, $\Delta W$ becomes a negative value, that is, the dimension of the resist pattern increases, so that the trimming ratio becomes a negative value of −2.0 at a mixture rate of 80%. When the mixture rate becomes 90% or more, $\Delta H$ which is the amount of decrease in a height of the resist pattern 5 as well as $\Delta W$ which is the amount of decrease in the dimension of the resist pattern becomes a negative value, so that the trimming ratio again becomes a positive value.

In the embodiment, a purpose is to reduce the dimension of the resist pattern, so that it is undesirable that $\Delta W$ become a negative value. The trimming ratio becomes 0.75 or less in the range in which $\Delta W$ is a positive (plus) value and the range in which the mixture rate of $C_3F_8$ gas at which the trimming ratio decreases is 10% to 40%, and as compared with a trimming ratio (1.5) of only $O_2$ gas to which $C_3F_8$ gas is not added, the trimming ratio can be set at a half or less. Also, in the case of a mixture ratio at which the trimming ratio is in the range of 0.4 to 0.7 and $\Delta W$ is the positive value, the amount $\Delta W$ of variation in the dimension of the resist pattern per unit time is large and a desired amount of variation in the dimension can be obtained in a short time. Particularly, the trimming ratio became a minimal value in the vicinity of a mixture rate of 25% and the dimension of the resist pattern could be reduced reproducibly.

Figure 11:
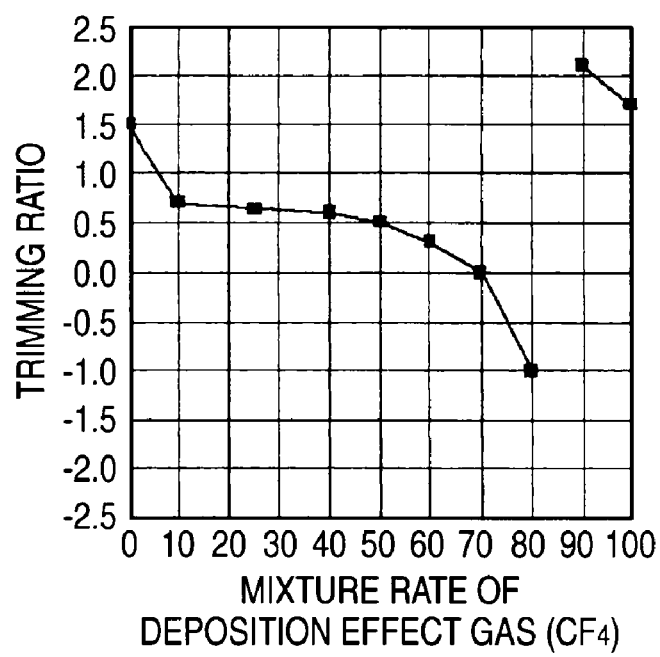
FIG. 11 is a diagram of relation between a trimming ratio and a mixture rate of deposition effect gas in the embodiment of the present invention.
Figure 12:
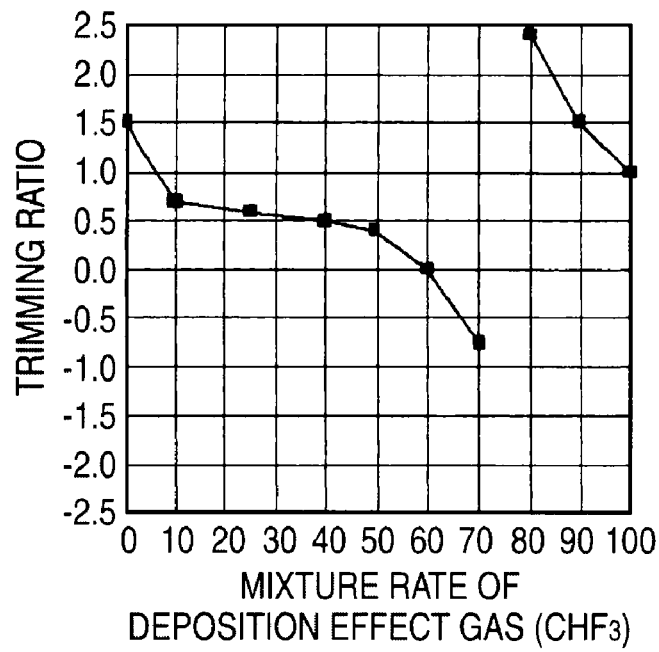
FIG. 12 is a diagram of relation between a trimming ratio and a mixture rate of deposition effect gas in the embodiment of the present invention.

Next, relations between trimming ratios and mixture rates at the time of dry etching of the case where methane trifluoride ($CHF_3$) gas and carbon tetrafluoride ($CF_4$) gas which is CF-based gas using carbon and fluorine similar to $C_3F_8$ gas as a main component are deposition effect gas are respectively shown in FIGS. 12 and 11.

In FIGS. 11 and 12, unlike FIG. 10 in which the deposition effect gas is $C_3F_8$ gas, as the mixture rate is increased from 0%, the trimming ratio decreases from 1.5 and the trimming ratio decreases to a negative value without increasing. In the case of using gas including hydrogen like $CHF_3$ gas, a deposition effect tends to become smaller than the case of using other gas, so that a thickness of a deposition layer becomes thin (several nm or less), but the deposition layer sufficient to avoid plasma damage could be formed.

These gases are characterized in that the deposition effect is great. As a result of this, when the mixture rate is increased, $\Delta H$ decreases and at a certain mixture rate, $\Delta H$ becomes 0 and also the trimming ratio becomes 0 and when the mixture rate is further increased, $\Delta H$ and the trimming ratio become negative values. When the mixture rate is further increased, $\Delta H$ also becomes a negative value, so that the trimming ratio becomes a positive value.

As described above, in the embodiment, a purpose is to reduce the dimension of the resist pattern, so that the range in which $\Delta W$ in which the dimension of the resist pattern reduces is positive is the range in which the trimming ratio is 0.3 to 0.7 and the mixture rate is 10% to 60% for $CF_4$ gas, and is the range in which the trimming ratio is 0.4 to 0.7 and the mixture rate is 10% to 50% for $CHF_3$ gas. Also, in the range in which the trimming ratio is 0.0 to 0.7 and $\Delta W$ is a positive value, the amount $\Delta W$ of variation in the dimension of the resist pattern per unit time is large and a desired amount of variation in the dimension could be obtained in a short time.

Figure 13:
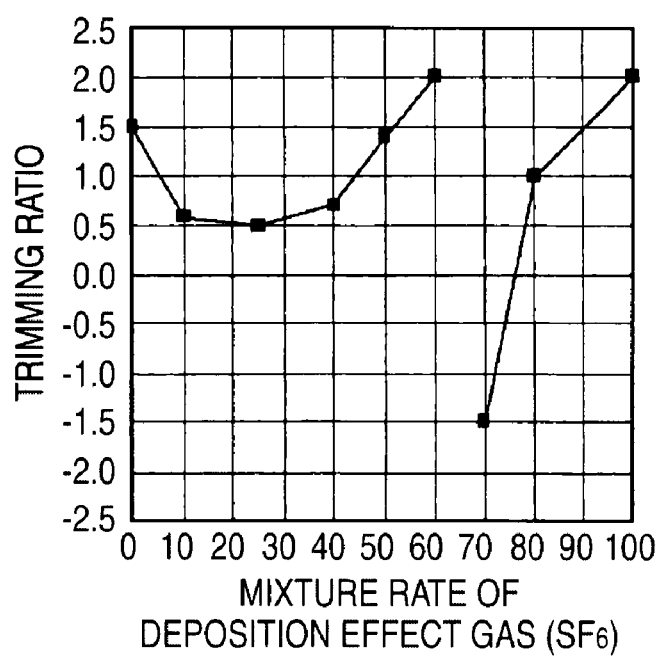
FIG. 13 is a diagram of relation between a trimming ratio and a mixture rate of deposition effect gas in the embodiment of the present invention.

Also, a relation between a trimming ratio and a mixture rate at the time of dry etching of the case of sulfur hexafluoride ($SF_6$) gas which is deposition effect gas whose main component is different from CF-based gas is shown in FIG. 13. The relation between the trimming ratio and the mixture rate of the case where the deposition effect gas is $SF_6$ gas exhibited behavior similar to the case where the deposition effect gas is $C_3F_8$ gas. In FIG. 13, when the mixture rate is increased from 0%, the trimming ratio decreases once, but increases again.

In the case where the deposition effect gas is $SF_6$ gas, a minimal value of the trimming ratio in the range in which $\Delta W$ is positive is the same value (about 0.5) as that of isotropic etching, and in the range in which the mixture rate is 10% to 50%, the trimming ratio could be made smaller than trimming (1.5) of the case where $SF_6$ gas is not mixed. Also, in the range in which the trimming ratio is 0.5 to 0.7 and $\Delta W$ is a positive value, the amount $\Delta W$ of variation in the dimension of the resist pattern per unit time could be increased and a desired amount of variation in the dimension could be obtained in a short time. Since the trimming ratio becomes a minimal value in the vicinity of a mixture rate of 25%, in order to reproducibly perform a reduction in the dimension of the resist pattern, it is desirable to perform the reduction in the range of the vicinity in which the trimming ratio becomes the minimal value or the vicinity of the mixture rate of 25%.

In addition, in the embodiment, the thickness of the silicon carbide drift layer is set at 20 μm and the n-type impurity concentration is set at $1\times10^{16}/cm^3$, but they are not limited to these values, respectively, and the thickness of the silicon carbide drift layer could be in the range of 5 to 50 μm and the n-type impurity concentration of the silicon carbide drift layer could be in the range of $1\times10^{15}$ to $1\times10^7/cm^3$. Also, the impurity concentration and the depth of impurity ions implanted in the first ion implantation step are set at $3\times10^{19}/cm^3$ from the surface of the silicon carbide drift layer to the depth of 0.3 μm, but they are not limited to these values and this impurity concentration could be, for example, $1\times10^{18}$ to $1\times10^{21}/cm^3$. Also, the impurity concentration and the depth of impurity ions implanted in the second ion implantation step are not limited to the conditions described above, and the depth could be deeper than an implantation depth of the first ion implantation step and also the impurity concentration could be sufficiently higher than a concentration of the first ion implantation step. The activation annealing conditions in the activation annealing step are set at 10 minutes and 1700° C. in the argon gas, but the conditions are not limited to these values and could be, for example, about 30 seconds to 1 hour at temperatures of 1300 to 1900° C. in inert gas. Also, the height of the first resist pattern is set at 2.5 μm, but is not limited to this value, and the height of the first resist pattern could be set so that the height of the second resist pattern becomes a predetermined height or more required as a mask of ion implantation.

As the gate insulating film of the gate insulating film formation step, a film obtained by thermally oxidizing the silicon carbide drift layer is shown, but the gate insulating film is not limited to this film, and a silicon oxide deposition film or other deposition films may be used. Also, metal such as titanium or aluminum formed by a sputtering method etc. may be used as the material of the gate electrode of the gate electrode formation step. Titanium, gold, etc. may be used as the material of the source electrode and the drain electrode of the electrode formation step.

Also, in the embodiment, the first conduction type is set at the n type and the second conduction type is set at the p type, but these conduction types may be reverse.

Further, in the second mask formation step of the embodiment, the examples of using $C_3F_8$ gas, $CF_4$ gas, $CHF_3$ gas and $SF_6$ gas as the deposition effect gas having a deposition effect on the resist pattern are shown, but as the deposition effect gas, methylene difluoride ($CH_2F_2$) gas, silicon tetrachloride ($SiCl_4$) gas, boron trichloride ($BCl_3$) gas, dichloromethane ($CCl_2H_2$) gas or these mixed gases may be used.

Also, in the second mask formation step, gas such as hydrogen gas or inert gas such as argon (Ar) without having a deposition effect may be used instead of oxygen gas having an etching effect on the resist pattern. A mixture ratio at which a trimming ratio is minimized varies depending on a selected gas kind, but a gas mixture ratio could be set so that the trimming ratio is minimized even in any combination of gas.

In addition, in the embodiment, the example of decreasing a height of a resist mask is shown as the example of change in shape of the resist mask by dry etching in the second mask formation step, but it is not always necessary to decrease the height of the resist mask and when a deposition effect is great in the dry etching of the second mask formation step, the height of the resist mask may be increased. In this case, ΔH takes on a negative value.

In addition, in the embodiment, as the method for reducing the width of the resist pattern, dry etching is used, but the width of the resist pattern may be reduced by heating the resist pattern. In this case, deterioration of a shape of the resist pattern by heating can be suppressed by heating the resist pattern in vacuum.

Further, in the activation annealing step of the embodiment, activation annealing is performed after the second resist pattern and the deposition layer are removed, but a protective layer in which the second resist pattern and the deposition layer are heated and carbonized in vacuum may be attached to perform annealing without removing the second resist pattern and the deposition layer. In this case, it becomes unnecessary to perform steps of forming and removing the carbon protective layer in the activation annealing step, and the number of manufacturing steps can be reduced further. Also, even when the carbon protective layer is formed on the protective layer in which the second resist pattern and the deposition layer are carbonized, it becomes unnecessary to perform a step of removing the second resist pattern and the deposition layer, so that a manufacturing step can be reduced.

What is claimed is:

1. A manufacturing method of a silicon carbide semiconductor apparatus, the method comprising:
   forming a first resist pattern on a surface of a silicon carbide layer formed on a silicon carbide substrate;
   implanting a first conduction type impurity ion in the silicon carbide layer on which the first resist pattern is formed;
   forming a second resist pattern by decreasing a width of the first resist pattern with etching and forming a deposition layer on the surface of the silicon carbide layer which is not covered with the second resist pattern, the deposition layer being a reaction product in which plasmas of etching gases including deposition effect gas react mutually, or a reaction product between a plasma of the etching gas including the deposition effect gas and the first resist pattern constructed of an organic material; and
   implanting a second conduction type impurity ion in the silicon carbide layer on which the second resist pattern is formed, through the deposition layer.

2. The manufacturing method according to claim 1, wherein the etching in the forming of the second resist pattern includes dry etching using the etching gas which is a mixed gas of oxygen gas and the deposition effect gas.

3. The manufacturing method according to claim 2, wherein a width of the first resist pattern is W1, a width of the second resist pattern is W2 and ΔW is defined by W1-W2,
   wherein a height of the first resist pattern is H1, a height of the second resist pattern is H2 and ΔH is defined by H1-H2, and
   wherein the etching in the forming of the second resist pattern is performed using the mixed gas at a mixture rate between oxygen gas and the deposition effect gas, with which a trimming ratio defined by ΔH/ΔW is minimized while ΔW is a positive value.

4. The manufacturing method according to claim 2, wherein the etching gas is propane octafluoride.

5. The manufacturing method according to claim 2, wherein:
   the deposition effect gas comprises one or more of $C_3F_8$, $CF_4$, $CHF_3$, $SF_6$, $CH_2F_2$, $SiCl_4$, $BCl_3$, and $CCl_2H_2$.

6. The manufacturing method according to claim 1, further comprising performing activation annealing for activating the first conduction type impurity ion and the second conduction type impurity ion implanted in the silicon carbide layer,
   wherein the activation annealing is performed while attaching a protective layer, which is formed by heating and carbonizing the second resist pattern and the deposition layer, to the surface of the silicon carbide layer.

7. The manufacturing method according to claim 1, further comprising:
   removing the deposition layer.

8. The manufacturing method according to claim 7, further comprising:
   forming a carbon protective layer on a surface of the silicon carbide layer.

9. The manufacturing method according to claim 8, further comprising:
   removing the carbon protective layer and depositing a gate insulating film.

* * * * *